July 25, 1967 A. HOPENGARTEN 3,333,201

TUNING INDICATOR CIRCUIT

Filed Jan. 24, 1964

TUNING INDICATION CIRCUIT CONNECTED TO TRANSFORMER COUPLED DISCRIMINATOR

F-V CHARACTERISTIC OF TUNED XFMR

VOLTAGES IN TUNING INDICATOR CIRCUIT

INVENTOR.
ABRAM HOPENGARTEN
BY
D R Pressman
ATTORNEY

United States Patent Office
3,333,201
Patented July 25, 1967

3,333,201

TUNING INDICATOR CIRCUIT

Abram Hopengarten, Lafayette Hills, Pa., assignor to Philco-Ford Corporation, a corporation of Delaware Filed Jan. 24, 1964, Ser. No. 340,005
10 Claims. (Cl. 325—455)

ABSTRACT OF THE DISCLOSURE

A circuit which provides a sharp-peaked tuning indication voltage for a receiver by combining detected versions of the primary and secondary voltages from a tuned IF transformer.

This invention relates to radio receivers, and particularly to tuning indicator circuitry for such receivers.

As is well known, the best reception is obtained by tuning a receiver accurately. To this end indicating devices such as tuning meters or electric eyes are usually included in quality receivers to aid the listener in obtaining precise and accurate tuning. These devices usually operate by monitoring the current in the automatic gain control (AGC) bus of the receiver. When the receiver is tuned to an incoming signal, the AGC current rise is indicated on the indicating device. The listener then fine tunes the receiver to obtain a maximum indication on the device; this will theoretically be the most accurate possible tuning. However one difficulty with this technique arises from the fact that the AGC current does not peak sharply when the receiver is fine tuned to the center of the band of an incoming station, but rather has a relatively flat peak whose center cannot be easily ascertained. Hence very accurate tuning is not possible with these devices.

In some FM receivers, the tuning indication device has been connected to monitor the direct voltage at the output of the discriminator. Correct tuning is indicated by a null on a zero-center meter. This arrangement suffers from the same disadvantage as the AGC-bus connected indicators since the discriminator output voltage curve does not have a sharply-defined null point.

The disadvantage of these indicator circuits become more pronounced in FM-stereo-multiplex receivers where accurate tuning is essential to satisfactory stereo reception.

OBJECTS

Accordingly several objects of the present invention are:

To provide new and improved receiver tuning means,

To provide means for accurately and precisely indicating the correct tuning of a receiver, and To provide a receiver tuning indicator circuit which provides a more pronounced indication as the receiver is correctly tuned to each incoming station.

Other objects and advantages of the present invention will become apparent from a consideration of the ensuing description thereof.

SUMMARY

A sharp-peaked station indication voltage is obtained, according to the present invention, by providing first means, responsive to the receiver's intermediate frequency (IF) signal, for providing a first continuous output signal having two voltage peaks when the frequency of said IF signal attains values above and below center frequency. Second means, also responsive to the IF signal, provides a second output signal having a substantially constant voltage when the frequency of said IF signal is between said values. Additional means are provided for subtracting said first output signal from said second output signal. In the embodiment disclosed, means are provided for subtracting a rectified version of the primary voltage from a rectified version of the secondary voltage in a tuned transformer which couples the intermediate frequency signal of the receiver.

DRAWING

DESCRIPTION

Figure 1:
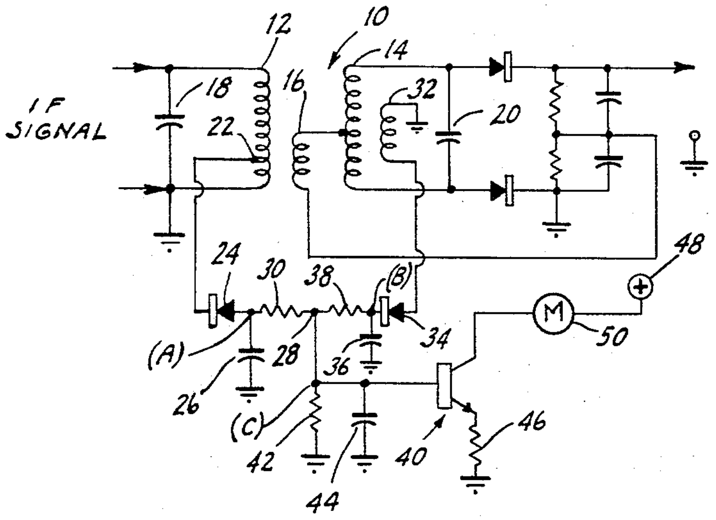
FIG. 1 is a tuning indicator circuit according to the present invention.

FIG. 1 shows a preferred form of the invention wherein the tuning indicator circuit is connected to a conventional transformer-coupled discriminator.

The circuit includes a closely-coupled transformer 10, having a primary winding 12, a secondary winding 14, and a tertiary winding 16. The primary and secondary windings are tuned to the frequency of the signal which is applied across the primary winding 12 (e.g., an intermediate frequency (IF) signal) by capacitors 18 and 20, respectively. Also shown are the diodes and resistor-capacitor load which complete the discriminator. However since those elements form no part of the present invention they will not be described in detail.

Figure 2:
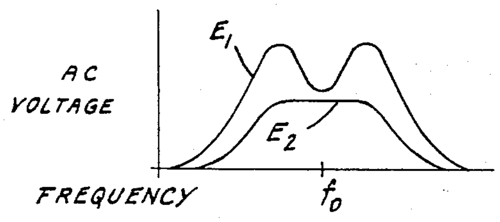
FIGS. 2 and 3 depict voltage-frequency curves at several points in the circuit of FIG. 1.

FIG. 2 shows a plot of the magnitudes of the AC voltages $E_1$ and $E_2$ existing across the primary winding 12 and secondary winding 14, respectively, as the frequency of a signal applied across the primary winding is varied about the frequency $f_0$ to which the primary and secondary windings are tuned. The IF signal in a receiver undergoes such a variation as the receiver is tuned to the signal of an incoming station. It can be seen that the voltage-frequency characteristic $E_1$ of the primary winding has two humps spaced about center frequency $f_0$. This characteristic, it will be recognized, is similar to that of an overcoupled transformer. The voltage-frequency characteristic $E_2$ of the secondary winding has a flat-topped single hump which resembles that of an optimum-coupled transformer.

The present invention, now to be described, utilizes these characteristics of a closely coupled tuned transformer to provide a tuning indication voltage with a sharp-peaked characteristic.

Connected to a tap 22 on primary winding 12 is the cathode of a diode 24. The anode of diode 24 is connected to ground by a capacitor 26 and to a junction 28 by a resistor 30.

The voltage on secondary winding 14 is sensed by a quaternary winding 32, one terminal of which is grounded and the other terminal of which is connected to the anode of a diode 34. The cathode of diode 34 is connected to ground by a capacitor 36 and to junction 28 by a resistor 38.

Junction 28 is connected to the base of a transistor 40 and to ground via paralleled resistor 42 and capacitor 44. The emitter of transistor 40 is connected to ground by resistor 46 and the collector is connected to a positive voltage source 48 by a meter or other suitable indicating device 50.

Figure 3:
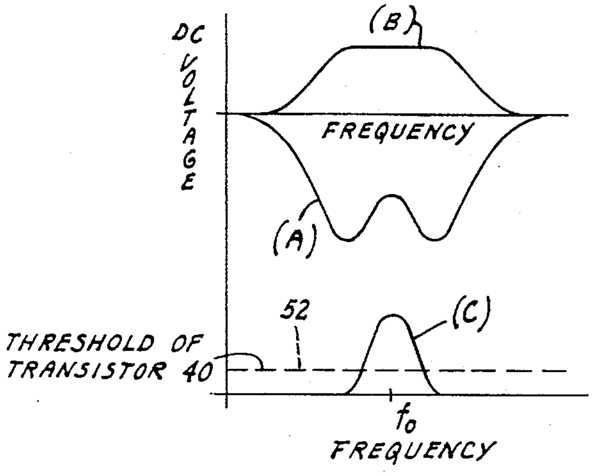

FIG. 3 shows voltage-frequency plots for various points in the circuit of FIG. 1. Curve (A) is the characteristic of the voltage at point (A) (the junction of diode 24, resistor 30, and capacitor 26); curve (B) is the characteristic of the voltage at point (B) (the junction of resistor 38, diode 34, and capacitor 36); and curve (C) is the characteristic of the voltage at point (C) (the junction of resistors 30, 38, and 42).

OPERATION

The tuning indication circuit of the present invention provides a relatively sharp voltage peak when the receiver is correctly tuned to a station by subtracting a detected version of the signal across primary winding 12 from a detected version of the signal across secondary winding 14.

More particularly, a portion of the primary voltage across winding 12 is rectified and filtered by diode 24 and capacitor 26. A resultant negative direct voltage will appear at their junction. The amplitude v. frequency characteristic of this voltage is similar in shape to the characteristic $E_1$ of FIG. 2 and is indicated as waveform (A) of FIG. 3. A portion of the secondary voltage across winding 14 is obtained across quaternary winding 32 and is rectified and filtered by diode 34 and capacitor 36. The resultant positive direct voltage will appear at their junction. The amplitude v. frequency characteristic of this voltage is similar in shape to characteristic $E_2$ of FIG. 2 and is indicated by waveform (B) of FIG. 3.

With the aid of isolation resistors 30 and 38 the signals represented by voltage waveforms (B) and (C) are combined at junction 28 and the result is a synthesized signal represented by the voltage waveform (C) of FIG. 3.

It will be noted that waveform (C) has a relatively sharp peak at center frequency $f_0$. A suitable voltmeter can be connected across resistor 42 to indicate this voltage. When the tuning of the receiver is adjusted to obtain a maximum reading on this meter, the receiver will be precisely tuned to the incoming signal. Other forms of voltage responsive indicating means, such as the so-called "electric eye," may be substituted for the meter.

In FIG. 1 the tuning indication circuit has been shown connected to drive an ammeter 50. The voltage at point 28 is developed across resistor 42 and controls the current through transistor 40 and hence meter 50. The system may be arranged so that meter 50 is inactive until a signal greater than a predetermined strength is received by varying resistor 42 and/or resistor 46 to adjust the threshold conduction level of transistor 40 is indicated by dashed line 52 in FIG. 3.

Although the tuning indication system of the invention is shown connected to the input transformer of an FM discriminator, it will be apparent that the circuit can be connected to any signal transformer or pair of windings so long as their frequency characteristics resemble those shown in FIG. 2.

The specific details of the specification should not be construed as limiting the invention since it will be apparent that various modifications and other embodiments will occur to those skilled in the art without departing from the scope of the invention. It is therefore desired that the invention be defined by the appended claims only.

I claim:

1. A system for providing a precise indication when the frequency of an input signal attains a first value, comprising:

(a) first means, responsive to said signal, for providing a first continuous output signal having a first voltage peak when the frequency of said input signal attains a second value lower than said first value and a second voltage peak when the frequency of said input signal attains a third value higher than said first value, (b) second means, responsive to said input signal, for providing a second output signal having a substantially constant voltage when the frequency of said input signal is approximately between said second and third values, (c) third means for subtracting said first output signal from said second output signal to produce a resultant signal, and (d) fourth means for providing an indication of the magnitude of said resultant signal.

2. The system of claim 1 wherein said first means includes a tuned primary winding of a transformer and said second means includes a tuned secondary winding of said transformer.

3. The system of claim 1 where said first means includes a tuned primary winding of a transformer and means for providing a rectified version of the signal across said tuned primary winding and said second means includes a tuned secondary winding of said transformer and means for providing a rectified version of the signal across said tuned secondary winding.

4. The system of claim 1 wherein said fourth means comprises an ammeter.

5. In combination:

(a) a transformer having at least a primary winding connected to a variable frequency signal source and a secondary winding, each of said windings being tuned to a particular frequency, (b) first means for subtracting a version of the signal appearing across said primary winding from a version of the signal appearing across said secondary winding, thereby to obtain a resultant signal, and (c) second means for indicating the magnitude of said resultant signal.

6. The combination of claim 5 wherein said first means includes means for rectifying and filtering the signal across each of said windings.

7. The combination of claim 6 wherein said second means comprises an ammeter.

8. A system for providing a precise indication when, in a receiver, the frequency of the intermediate frequency signal supplied to the primary winding of an intermediate frequency transformer having tuned primary and secondary windings equals the frequency to which said windings are tuned, comprising:

(a) first means coupled to said primary and secondary windings for subtracting a rectified and filtered version of the signal appearing across said primary winding from a rectified and filtered version of the signal appearing across said secondary winding, thereby to provide a resultant signal, and (b) second means coupled to said first means for indicating the magnitude of said resultant signal.

9. The system of claim 8 wherein said first means includes a first diode having the cathode thereof connected to the primary winding of said transformer, an auxiliary winding coupled to said secondary winding arranged for sensing the signal appearing thereacross, and a second diode having an anode connected to one end of said auxiliary winding, the other electrodes of said two diodes being joined to a terminal by respective resistors.

10. The system of claim 9 wherein said terminal is connected to the input of a transistor amplifier, the output of which includes an ammeter.

References Cited

UNITED STATES PATENTS

| | | | |
|---|---|---|---|
| 2,286,413 | 6/1942 | Herold et al. | 325—455 X |
| 3,038,123 | 6/1962 | Crimmins | 334—36 X |

KATHLEEN H. CLAFFY, *Primary Examiner.*

R. LINN, *Assistant Examiner.*